United States Patent [19]

Catlin

[11] Patent Number: 5,061,825
[45] Date of Patent: Oct. 29, 1991

[54] PRINTED CIRCUIT BOARD DESIGN FOR MULTIPLE VERSIONS OF INTEGRATED CIRCUIT DEVICE

[75] Inventor: Robert W. Catlin, Santa Clara, Calif.

[73] Assignee: Chips and Technologies, Inc., San Jose, Calif.

[21] Appl. No.: 592,157

[22] Filed: Oct. 3, 1990

[51] Int. Cl.[5] .............................................. H05K 1/00
[52] U.S. Cl. .................... 174/261; 174/262; 174/266; 439/68; 439/70; 361/403
[58] Field of Search ........................ 439/55, 65, 68, 70; 361/406, 397, 403; 174/250, 254, 262, 266, 261

[56] References Cited

U.S. PATENT DOCUMENTS

| | | | |
|---|---|---|---|
| 3,780,431 | 12/1973 | Feeney | 174/250 |
| 4,037,047 | 7/1977 | Taylor | 174/250 |
| 4,467,400 | 8/1984 | Stopper | 361/406 |
| 4,854,039 | 8/1989 | Wendt | 174/250 |

*Primary Examiner*—Leo P. Picard
*Assistant Examiner*—Trinidad Korka
*Attorney, Agent, or Firm*—Townsend and Townsend

[57] ABSTRACT

A printed cirucit board design capable of accepting both first and second versions of an IC device. First and second IC devices (10, 20) have pins disposed along respective first and second rectangular peripheries (12a–b and 15a–b; 22a–b and 23a–b). Each pin on the first IC devices has a functional counterpart pin on the second IC device. The board configuration contains pads in first and second arrays (32a–b and 35a–b; 32a, 32c, 33a–b) that correspond to the pins on the first and second IC devices. At least some of the pads (32b) of the first array do not physically conicide with pads in the second array and are located within the rectangle defined by the second array. Each non-overlapping pad in the first array is connected by a circuit board trace (40) to a respective pad in the second array such that each circuit board trace joins two pads corresponding to counterpart pins.

10 Claims, 1 Drawing Sheet 5,061,825

PRINTED CIRCUIT BOARD DESIGN FOR MULTIPLE VERSIONS OF INTEGRATED CIRCUIT DEVICE

BACKGROUND OF THE INVENTION

The present invention relates to techniques for configuring printed circuit (PC) boards.

One common type of integrated circuit (IC) device packaging technique provides pins around a rectangular package perimeter. The pins may be bent perpendicular to the plane of the chip and soldered into holes in the PC board (referred to as through-hole mount), or may be bent with the ends of the pins parallel to the plane of the chip and soldered to pads on the board surface (referred to as surface-mount). However, IC devices are constantly evolving, and may it may be desirable for a later generation of an IC device to include additional circuitry for new features, diagnostics, or perhaps operation in multiple modes. In many such cases, the new IC device will require more pins than the old IC device.

This creates problems for a board manufacturer who wishes to offer products based on both versions of the IC device. Clearly, the existing board that was designed to accommodate the old version will not accommodate the new version. Equally serious, however, is the problem that a new circuit board, designed for the new version, will not accommodate the old version. Thus the manufacturer is confronted with having to maintain two boards in inventory, which is undesirable.

SUMMARY OF THE INVENTION

The present invention provides a printed circuit board design capable of accepting both first and second versions of an IC device. The invention provides an efficient board layout while obviating the need for two or more boards.

The invention presupposes first and second IC devices, having pins disposed along respective first and second rectangular peripheries. The second IC device is assumed to have more pins, and thus its rectangle is larger than the first in at least one dimension. Each pin on the first IC device has a functional counterpart pin on the second IC device.

The board configuration contains a set of pads to accommodate both IC device versions. The pads can be considered to lie in first and second arrays that correspond to the pins on the first and second IC devices. At least some of the pads of the first array do not physically coincide with pads in the second array and are located within the rectangle defined by the second array. Each non-overlapping pad in the first array is connected by a circuit board trace to a respective pad in the second array such that each circuit board trace joins two pads corresponding to counterpart pins.

In a specific embodiment, the first IC device has two rows of M pins and two columns of N pins, and the second IC device has two rows of M pins, and two columns of (N+D) pins. The first array includes first and second rows of M pads each and first and second columns of N pads each, laid out in the M-by-N rectangular configuration of the first IC device. The second array includes first and second rows of M pads each and first and second columns of (N+D) pads each, laid out in the M-by-(N+D) rectangular configuration of the second IC device.

The first row and both columns of the first array coincide with counterpart portions of the second array while the second row is non-overlapping and located inside the second array. Counterpart pads in the second rows of the two arrays are connected to each other by respective circuit board traces.

A further understanding of the nature and advantages of the present invention may be realized by reference to the remaining portions of the specification and drawings.

DESCRIPTION OF SPECIFIC EMBODIMENTS

Figure 1:
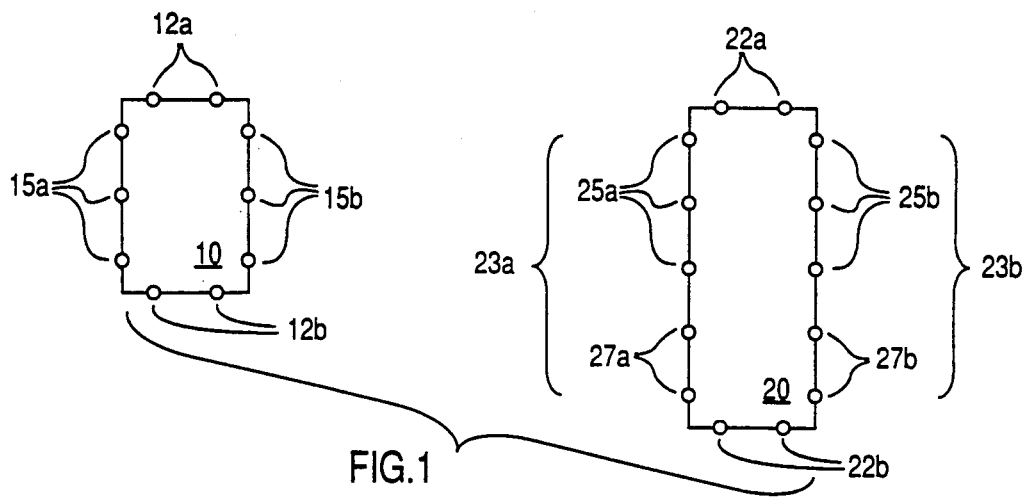
FIG. 1 is a schematic view showing first and second IC devices.

FIG. 1 is a schematic view showing the pin arrangements for first and second IC devices, each of which is contained in a package that provides pins disposed about a rectangular periphery. In particular, a first IC device 10 includes a first row of M pins 12a, a second row of M pins 12b, a first column of N pins 15a, and a second column of N pins 15b. A second IC device 20 includes a first row of M pins 22a, a second row of M pins 22b, a first column of (N+D) pins 23a, and a second column of (N+D) pins 23b. Pins 23a in the first column include a group of N pins 25a and a group of D pins 27a. Similarly, the second column includes a group of N pins 25b and a group of D pins 27b. Normally, the pins in each row and column are equally spaced.

IC devices 10 and 20 are compatible in the sense that pins 12a are functional counterparts of pins 22a, pins 12b are counterparts of pins 22b, pins 15a are counterparts of pins 25a, and pins 15b are counterparts of pins 25b. Pins 27a and 27b represent pins that are needed to implement additional features present in IC device 20, and have no counterparts in IC device 10.

While the schematic figure shows relatively small numbers of pins, it should be understood that a typical VLSI device package could have 25 or more pins in each of its rows and columns. Furthermore, in many instances the manufacturer of the IC device will specify that certain pins are not to be connected to any off-chip circuit elements. Such pins may be for test purposes, or may merely reflect the manufacturer's desire to use a standard sized package.

Figure 2:
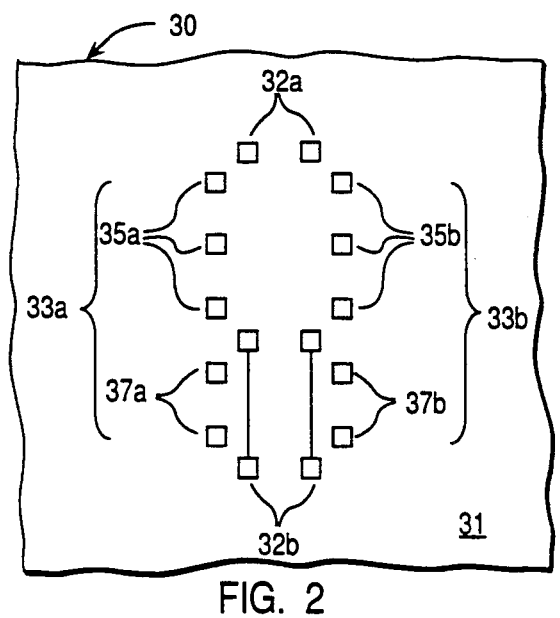
FIG. 2 is a schematic view showing a region of a PC board adapted to accommodate either of the two devices.

FIG. 2 is a schematic illustrating a region of a printed circuit (PC) board 30 having a substrate 31 on which are located mounting pads to accommodate both of the two IC device configurations described above. In this regard it should be noted that the term "pad" is used generically to refer to a plated hole for through-hole mounted devices or a surface pad for surface-mount devices.

The relevant region of the PC board includes an overall set of pads that includes first and second arrays corresponding to the first and second IC devices. For the specific IC devices shown in FIG. 1, the overall set of pads in FIG. 2 includes first, second, and third rows containing pads 32a, 32b, and 32c, each row having M pads, and first and second columns containing pads 33a and 33b, each column having (N+D) pads. The first column includes a first column portion of N pads 35a and a second column portion of D pads 37a. Similarly, the second column contains a first column portion of N pads 35b and a second column portion of D pads 37b.

Pads 32a and 32c, and 33a and 33b are configured to accommodate the pins on IC device 20. Pads 32b are located between the first and second rows at a distance so that they accommodate pins 12b when IC device 10 is mounted with pins 12a on pads 32a, pins 15a on pads 35a, and pins 15b on pads 35b. A plurality of M circuit board traces 40 connect respective ones of pads 32b and 32c.

For simplicity, the board is illustrated without the board traces that connect the chip to other circuitry. In a typical embodiment, the traces for the second row of pins on the IC devices lead to pads 32c, the traces for the remaining pins on the first IC device lead to pads 32a, 35a, and 35b, and the traces for the new pins on the second IC device lead to pads 37a and 37b.

The present invention requires that the pin configuration is such that the row containing pins 12b is not so long that the outermost pair of pads 32b are too close to pads 37a and 37b. This requirement is normally met by standard Quad Flat Pack (QFP) packages.

The specific embodiment described above is a special case where IC device 20 is taller but no wider than IC device 10. In this case, the array of pads for IC device 10 overlaps the array for IC device 20 on three of the former's four sides. Thus, the second row of pads for IC device 10 are the only pads that don't coincide with pads that accommodate IC device 20.

Figure 3A:
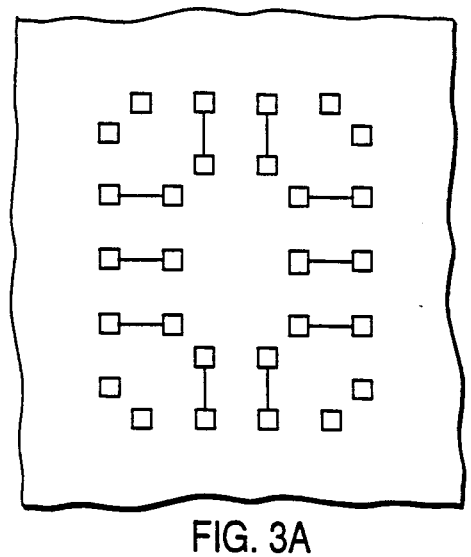
FIGS. 3A, 3B, and 3C show PC board layouts for alternative embodiments.
Figure 3B:
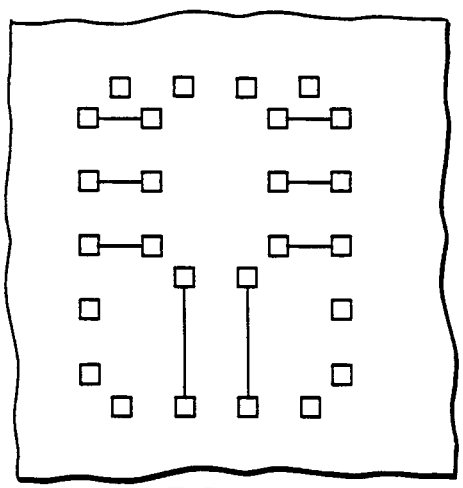
Figure 3C:
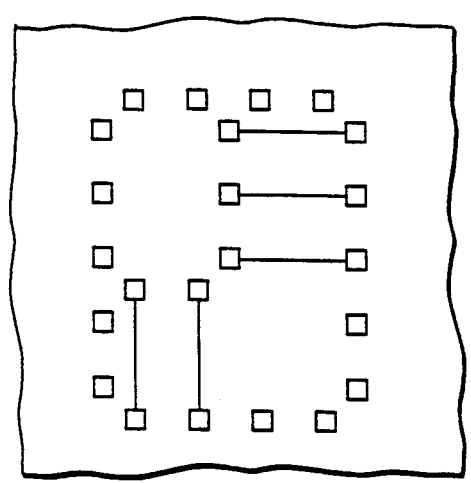

In general, there will be at least some pads for the first IC device that don't coincide with pads for the second IC device. In principle, depending on the respective pinouts, there may be coincidence on zero, one, two, or three sides. FIGS. 3A, 3B, and 3C show board layouts for the three possible cases where the second IC device is both taller and wider than the first IC device. FIG. 3A shows the case where the first array is located entirely within the second (no coincidence), and has circuit board traces extending from all four sides of the first array. FIG. 3B shows coincidence on one side so that circuit board traces extend from three sides. FIG. 3C shows coincidence on two sides so that traces extend from two sides.

In conclusion, it can be seen that the present invention provides a simple and elegant PC board configuration that accommodates different generations of an IC device with no wasted board overhead.

While the above is a complete description of a number of embodiments, various modifications, alternatives, and equivalents may be used. For example, while the circuit board traces for the second row of pins on IC devices 10 and 20 are described as leading to pads 32c, other routing considerations might make it preferable for those traces to lead to pads 32b. Additionally, IC devices 10 and 20 are shown as having identical pinouts on three sides. However, the pins on IC 20 that are counterparts of pins 15a and 15b could as well have been located in the central region of the columns so that separate pads would be required for pins 12a.

Therefore, the above description should not be taken as limiting the scope of the invention which is defined by the appended claims.

What is claimed is:

1. A printed circuit board for accepting either of first and second integrated circuit devices, the first device having pins in a first configuration disposed along a first rectangle, the second device having pins in a second configuration disposed along a second rectangle, larger than the first in at least one dimension, each pin on the first device having a functionally equivalent counterpart pin on the second device, comprising:
   a substrate;
   a first array of pads on said substrate, said first array being disposed according to the first configuration so as to match the pins of the first device;
   a second array of pads on said substrate, said second array of pads being disposed according to the second configuration so as to match the pins of the second device;
   said first and second arrays being related such that said first array has at least some pads, designated non-overlapping pads, that do not physically coincide with pads of said second array, each non-overlapping pad of said first array being located within the rectangle defined by said second array; and
   a plurality of circuit board traces, each connecting a respective given non-overlapping pad in said first array with a respective pad in said second array, wherein each circuit board trace connects two pads that correspond to counterpart pins.

2. The circuit board of claim 1 wherein the pads are configured to receive surface-mount devices.

3. The printed circuit board of claim 1 wherein said first and second arrays coincide on one side.

4. The printed circuit board of claim 1 wherein said first and second arrays coincide on two sides.

5. The printed circuit board of claim 1 wherein said first and second arrays coincide on three sides.

6. The printed circuit board of claim 1 wherein said first and second arrays do not coincide at all.

7. A printed circuit board for accepting either of first and second integrated circuit devices, the first device having two rows of M pins and two columns of N pins, the second device having two rows of M pins and two columns of (N+D) pins characterized by a predetermined separation, comprising:
   a substrate;
   first and second rows of pads on said substrate, each having M pads;
   first and second columns of pads on said substrate, each having (N+D) pads;
   said first and second columns and first and second rows being disposed in a rectangular configuration commensurate with the pins on the second device;
   a third row of M pads, located between said first and second rows, and displaced relative to said second row such that said first and third rows and portions of said first and second columns are dispersed in a rectangular configuration commensurate with the pins on the first device; and
   circuit board traces connecting respective pads in said second and third rows.

8. The printed circuit board of claim 7 wherein the separation between adjacent pads is the same for said rows and columns 9. The circuit board of claim 7 wherein M and N are unequal.

10. The circuit board of claim 7 wherein the pads are configured to receive surface-mount devices.

* * * * *